(12) United States Patent
Liao et al.

(10) Patent No.: US 8,262,254 B2
(45) Date of Patent: Sep. 11, 2012

(54) CARRIER STRUCTURE FOR MOUNTING LED CHIPS

(75) Inventors: Chun-Ying Liao, Taipei Hsien (TW); Ching-Chi Cheng, Taipei Hsien (TW)

(73) Assignee: Advanced Connectek Inc., Taipei Hsien (TW)

( * ) Notice: Subject to any disclaimer, the term of this patent is extended or adjusted under 35 U.S.C. 154(b) by 308 days.

(21) Appl. No.: 12/621,639

(22) Filed: Nov. 19, 2009

(65) Prior Publication Data

US 2010/0308352 A1  Dec. 9, 2010

(30) Foreign Application Priority Data

Jun. 9, 2009 (TW) .............................. 98210239 U

(51) Int. Cl.
*H01L 33/00* (2010.01)

(52) U.S. Cl. ................... 362/249.01; 257/100

(58) Field of Classification Search .................... 257/99, 257/100, E33.072; 362/249.01, 249.1
See application file for complete search history.

(56) References Cited

U.S. PATENT DOCUMENTS

| | | | | |
|---|---|---|---|---|
| 2004/0079957 A1* | 4/2004 | Andrews et al. | ............. | 257/100 |
| 2004/0264184 A1* | 12/2004 | Choi et al. | ............. | 362/231 |
| 2007/0018191 A1* | 1/2007 | Roh et al. | ............. | 257/99 |

FOREIGN PATENT DOCUMENTS

JP  2003046135 A  *  2/2003

* cited by examiner

*Primary Examiner* — Thomas L Dickey
(74) *Attorney, Agent, or Firm* — Rosenberg, Klein & Lee

(57) ABSTRACT

A carrier structure for mounting at least an LED chip includes at least a lead and a base. The LED chip housed inside the base is coupled parallel with an electronic element. The lead is connected electrically to the LED chip at one end, while another end is exposed to the atmosphere. The base encaving the lead further has a shallow accommodation room to mount the electronic element at a surface not the same with the surface that mounts the LED chip.

12 Claims, 8 Drawing Sheets

CARRIER STRUCTURE FOR MOUNTING LED CHIPS

This application claims the benefit of Taiwan Patent Application Serial No. 098210239, filed Jun. 9, 2009, the subject matter of which is incorporated herein by reference.

BACKGROUND OF THE INVENTION (1) Field of the Invention

The invention relates to a carrier structure for mounting light-emitting diode (LED) chips, more particularly to the carrier structure that can provide superior shuttering protection for the LED chips mounted thereon.

(2) Description of the Prior Art

Various merits of a typical LED product can be found; such as a long service life, a reduced size, high vibration resistance, low heat generation, low energy consumption and so on. Hence, the LED products are widely applied to various indicators and light sources for household and/or workplace usage. Recently, the trend in the LED technology is moving toward color and high-illumination products, and the application of the LEDs has been extended to large-scaled outdoor displaying, traffic signaling and the like. It can be foreseen that the LED with its features in energy saving and green powering will definitely become the mainstream in future illumination industry.

However, the LED is vulnerable in usage. For example, the LED cannot sustain abnormal electric currents to flow by, and cannot afford to carry a higher electric voltage, either. Generally, while in facing those incidents, the LED would be broken so as to lead to a short circuit or an open circuit.

In the art, a protection circuit is usually used to protect the LED by paralleling to the LED chip. While in meeting an unexpected (high) surge voltage, the extra voltage will be shared by the protection circuit, and the LED chip in the parallel circuit can thus be saved.

Nevertheless, it would degrade the illumination efficiency of the LED chip if both the LED chip and the protection circuit are constructed close to each other at the same bonding surface. Referring to FIG. 1, a typical LED packaging is shown. The package to mount the LED chip 20 includes a housing 40 and a lead frame 30. The LED chip 20 wired to the lead frame 30 is laid on the housing 40 in a concave room thereof. The protection circuit 50 also laid in the concave room and wired to the lead frame is arranged neighborly to the LED chip 20. It is noted that the LED chip 20 and the protection circuit 50 are posed in an electric parallel relationship in the package of FIG. 1.

By providing the arrangement of the LED chip 20 and the protection circuit 50 in the package as shown in FIG. 1, a shuttering effect would be formed to degrade the illumination of the LED chip 20. Moreover, the illumination pattern of the LED chip 20 might be altered to some extent. An alternative to the design of FIG. 1 is shown in FIG. 2, in which the protection circuit 50 is located under the LED chip 20 by being buried into the housing 40'. However, though the shuttering problem of the design in FIG. 1 might be resolved by the design of FIG. 2, yet the cost for this change would be considerable and yield of the package of FIG. 2 would be lower by compared to that of FIG. 1.

SUMMARY OF THE INVENTION

Accordingly, it is an object of the present invention to provide a carrier structure for mounting LED chips, by which the mounting surface of the LED chips can differ from that of other electronic elements; such that the aforesaid shuttering problem can be reduced to a minimum, a cost hike for providing the LED assembly can be avoided, and the yield thereof can be ensured.

In the present invention, the carrier structure for mounting LED chips can include at least a lead and a base. The base laying out the lead is to mount the LED chip. One end of the lead is coupled with the LED chip, while another end to expose to the base.

The base further includes a reflection bowl structure for concentrating lights emitted by the LED chip that centers the reflection bowl structure.

The base can further include a heat-dissipating block and an insulation base. The insulation base accommodates part of the heat-dissipating block, which the heat-dissipating block extends inward from the outsides of the base to bear thereon the LED chip.

In the present invention, an accommodation room of the base is to locate a respective electronic element coupled with the LED chip, in which the electronic element can be part of a driving unit or a protection circuit.

All these objects are achieved by the carrier structure for mounting LED chips described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a carrier structure for mounting LED chips. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 3:
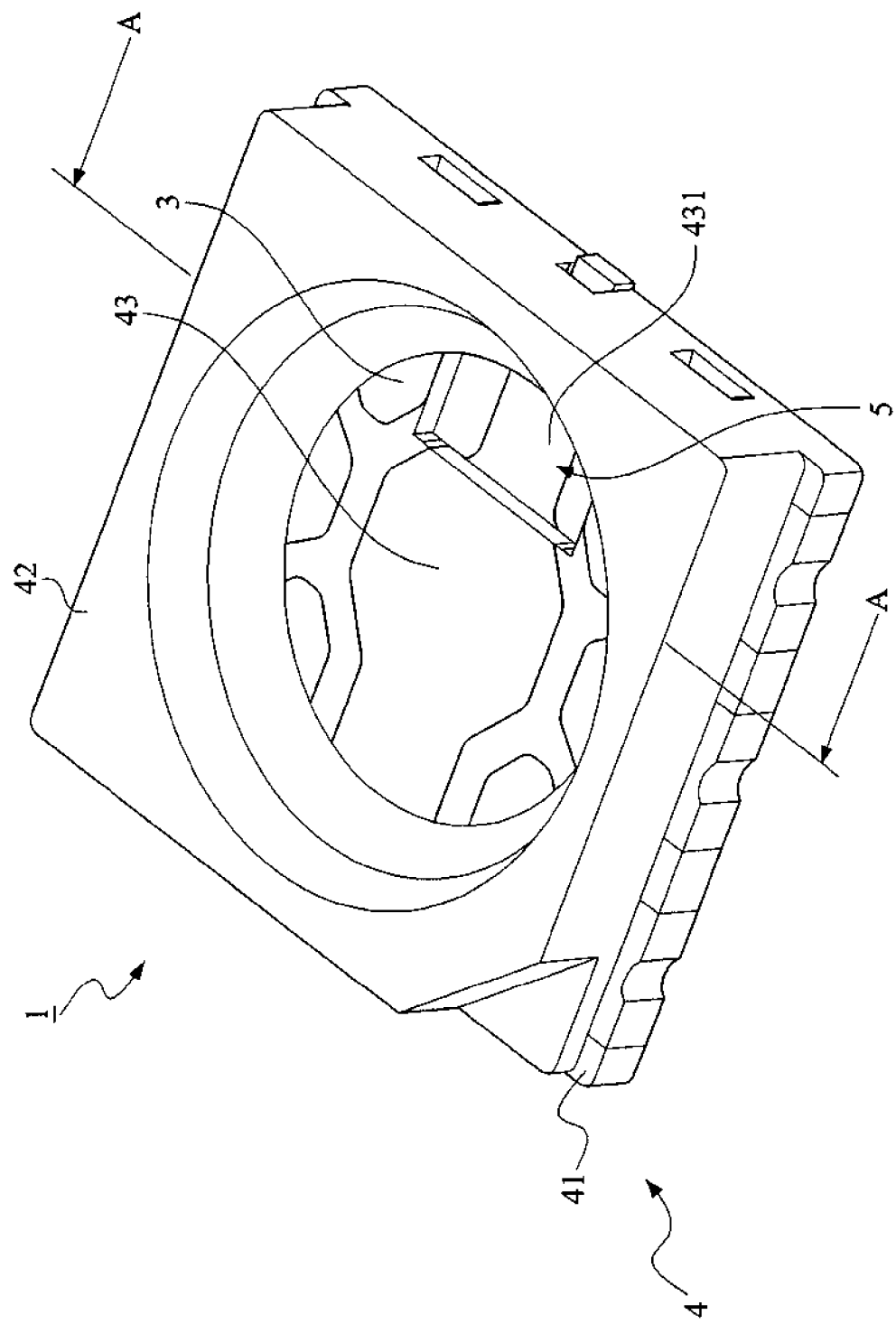
FIG. 3 is a perspective view of a first embodiment of the carrier structure for mounting LED chips in accordance with the present invention.

Referring now to FIG. 3, FIG. 4, FIG. 4A and FIG. 5, a perspective view of a first embodiment of the carrier structure 1 in accordance with the present invention, a perspective view of a base 4 of the carrier structure 1, a perspective view of leads 3 and a heat-dissipating block 43 of the carrier structure 1, and a cross-sectional view of FIG. 3 along line AA are shown, respectively. The carrier structure 1 includes at least one conductive lead 3 (six leads 3 shown in the figures) and one base 4. It is noted that in FIG. 5 one LED chip 20 and one electronic element 50 are additionally included to demonstrate respective occupations in the carrier structure 1.

The base 4 provides relevant empties to house the leads 3 in a radiant pattern. One end of any lead 3 is connected with an LED chip 20 located in middle of the base 4, while the other end thereof is extended outward so as to further connect to a printed circuit board (not shown herein).

Figure 5:
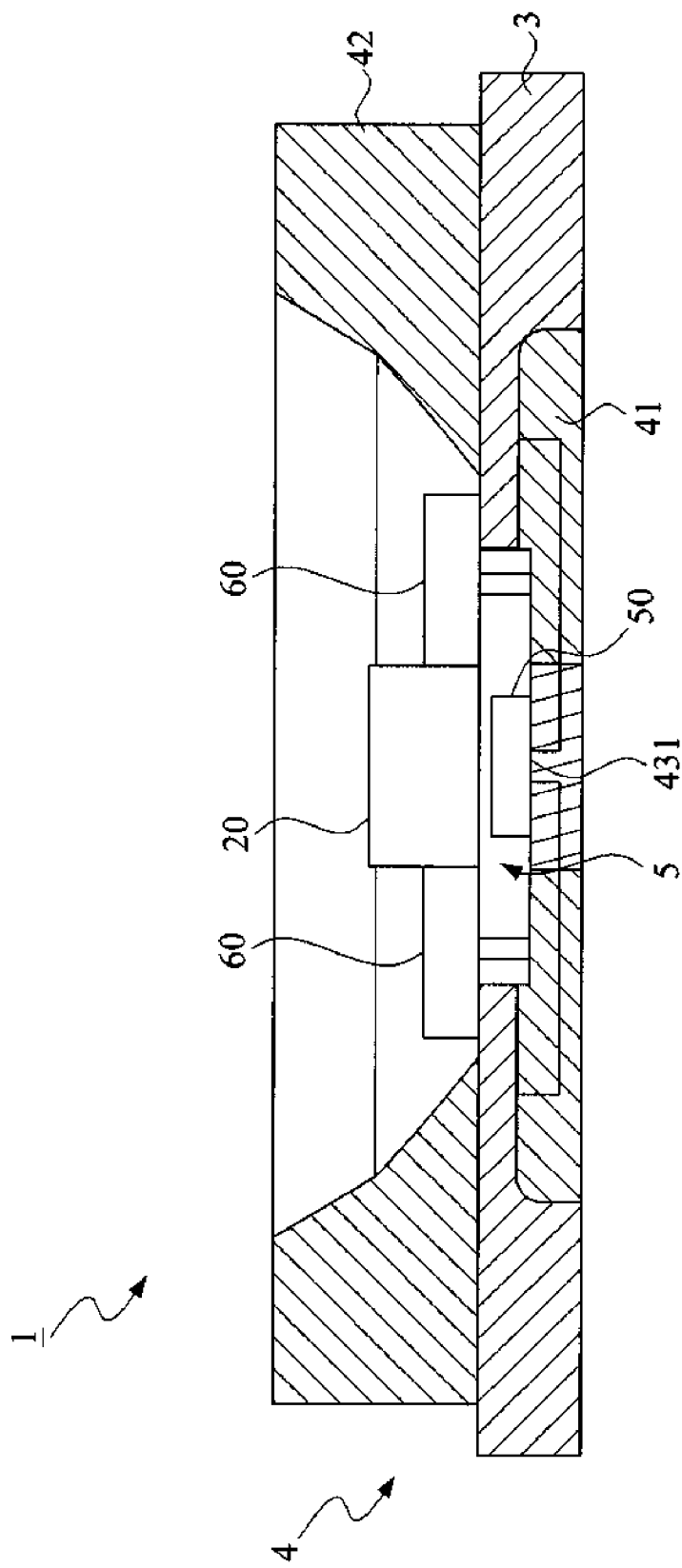
FIG. 5 is a cross-sectional view of FIG. 3 along line AA.

The base 4 has an accommodation room 5 for containing an electronic element 50 at an upper portion of the base 4, preferably at the middle upper portion thereof. As shown in FIG. 5, for the LED chip 20 is located strictly above the electronic element 50, such that the concerned shuttering effect upon the LED chip 20 by the electronic element 50, leading to degrade the illumination of the LED chip 20 and distort the illumination pattern, can be thoroughly resolved.

The base 4 further includes a lower insulation base 41, an upper bottom-off reflection bowl structure 42 and a heat-dissipating part 43. The insulation base 41 can be made of a plastics and the like. The reflection bowl structure 42 can be made of a metallic material, such as aluminum, silver, and any material that can form a light-reflection interior surface. Alternative, the reflection bowl structure 42 can be made of a plastic material coated interiorly a metallic reflection layer. As shown in FIG. 3, the accommodation room 5 is located on the insulation base 41 but under the bottom-off reflection bowl structure 42.

Figure 4:
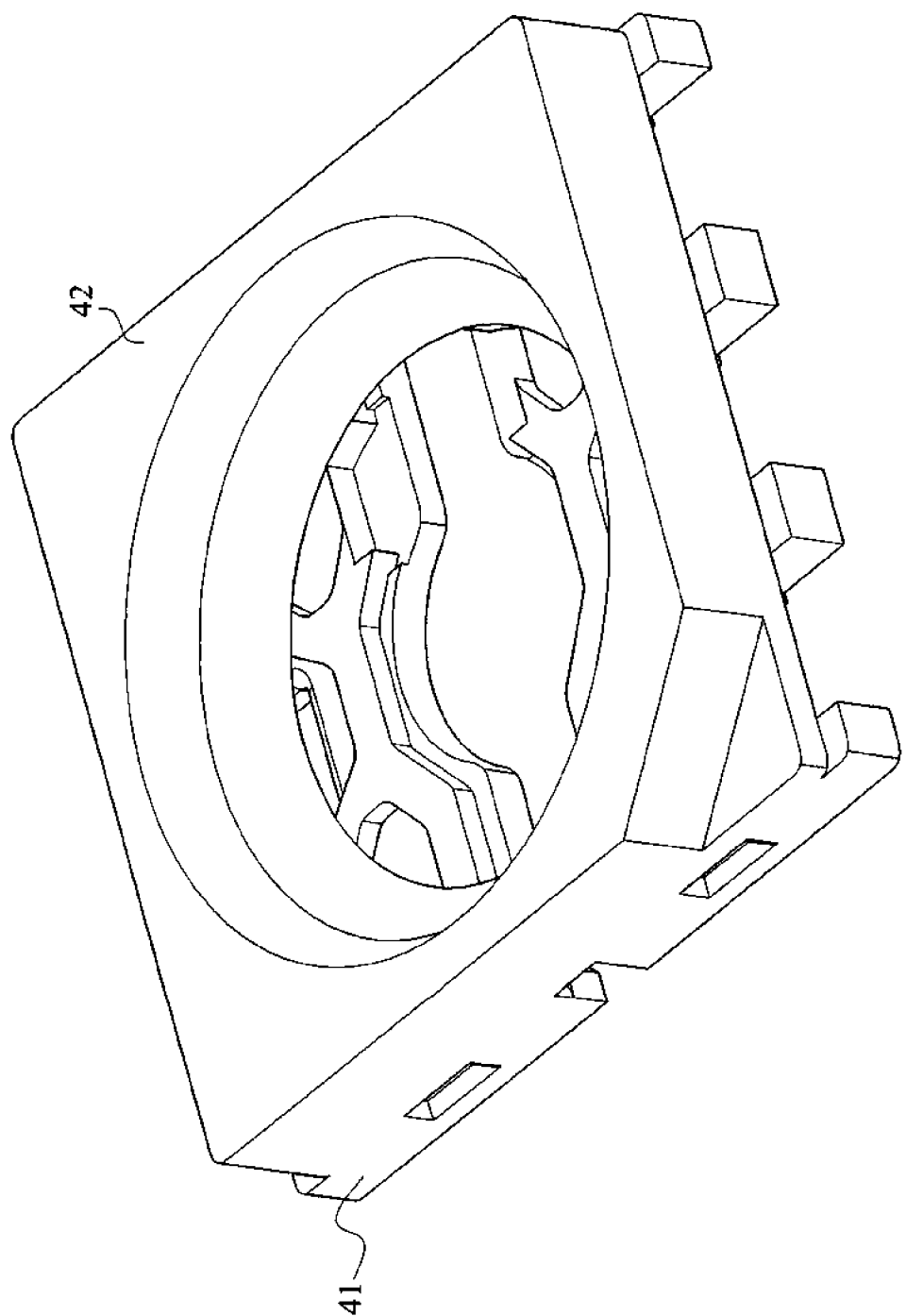
FIG. 4 shows the base of FIG. 3.

The heat-dissipating part 43 is made of a heat-conductive material; such as a metal, a metal alloy, a ceramic material, or any material that presents acceptable heat-dissipation properties. In the present invention, the heat-dissipating part 43 and the leads 3 can be made of the same material. By providing an adequate pathway design in the insulation base 41 as shown in FIG. 4, the insulation part 42 can be arranged to be encaved in a lower portion of the insulation base 41 with one end thereof exposed to the atmosphere, a middle portion thereof exposed to the bottom area of the bottom-off reflection bowl structure 42 so as to sustain thereon the LED chip 20 and the electronic element 5, and another end thereof extended further to be exposed to the atmosphere opposing to said one end. It is noted from FIG. 3 and FIG. 5 that said middle portion of the heat-dissipating part 43 is formed as a step structure so as to have this end structured to provide a wall to the accommodation room 5 and a platform protrusion 431 to uphold the electronic material 50 in the accommodation room 5. The platform protrusion 431 is preferably extended to be said another end of the heat-dissipating part 43. By providing the heat-dissipating part 43 of the present invention, heat generated by the LED chip 20 and the electronic element 50 can be forwarded all the way along the heat-dissipating part 43 to dissipate into the atmosphere.

In the present invention, the insulation base 41 and the reflection bowl structure 42 can be integrally formed as a unique piece, as shown in FIG. 4. It is also clearly seen the pathway design in the insulation base 41, which is there to receive the leads 3 and the heat-dissipating part 43.

Figure 4A:
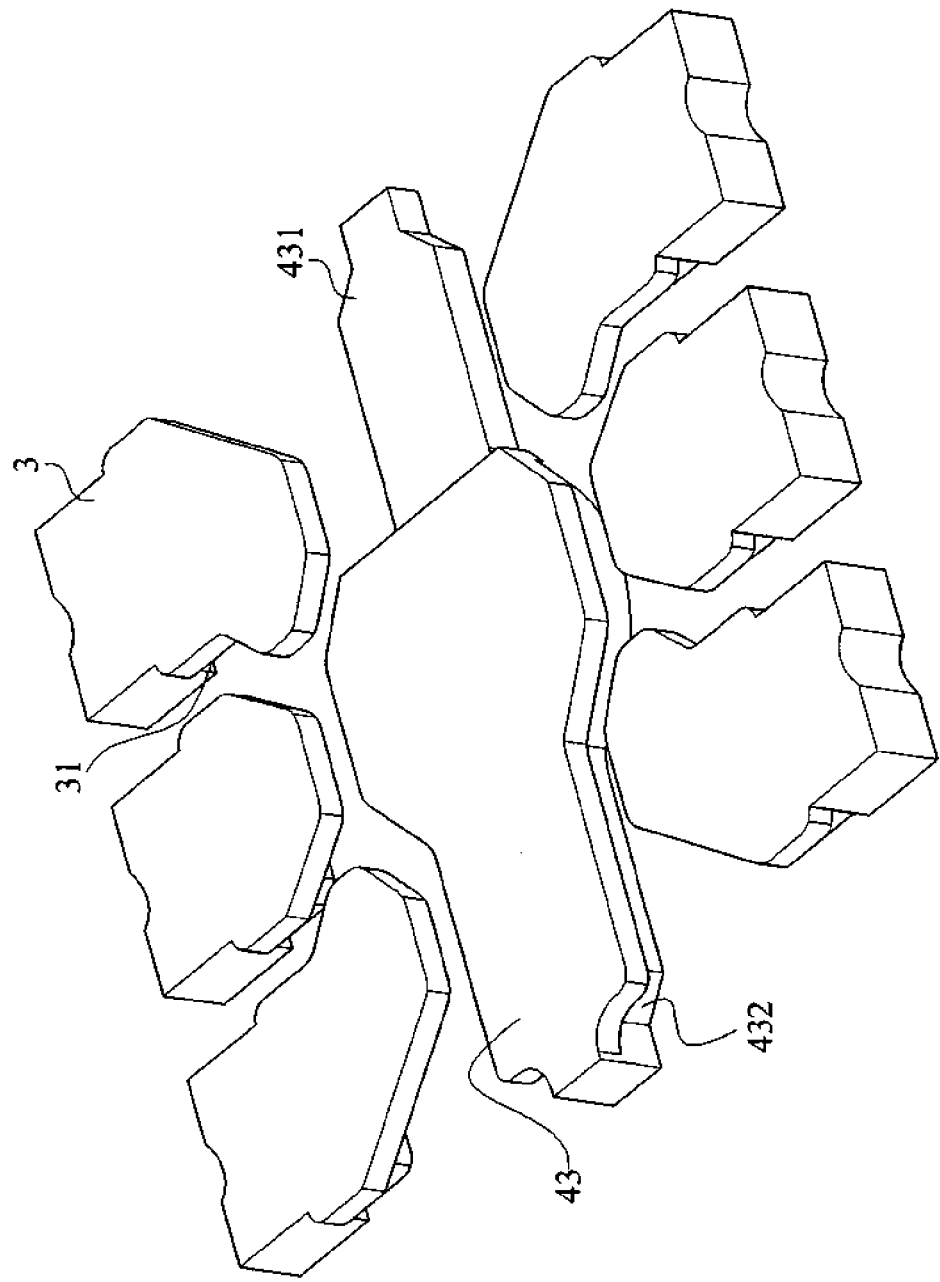
FIG. 4A shows the lead and the heat-dissipating block of FIG. 3.

As shown in FIG. 4A, the leads 3 and the heat-dissipating part 43 further have their own configuration stops 31 and 432, respectively, to help the leads 3 and the heat-dissipating part 43 engaged into the insulation base 41. Also, the step structure in the middle portion of the heat-dissipating part 43 is clearly demonstrated at the right portion of the heat-dissipating part 43, viewed from FIG. 4A.

As shown in FIG. 5, the LED chip 20 is coupled with the leads 3 through properly wiring 60. The electronic element 50 located in the accommodation room 5 can be a drive chip or a protection circuit. In the case that the electronic element 50 is a protection circuit, the voltage across the electronic element 50 should be larger than that across the LED chip 20.

Figure 6:
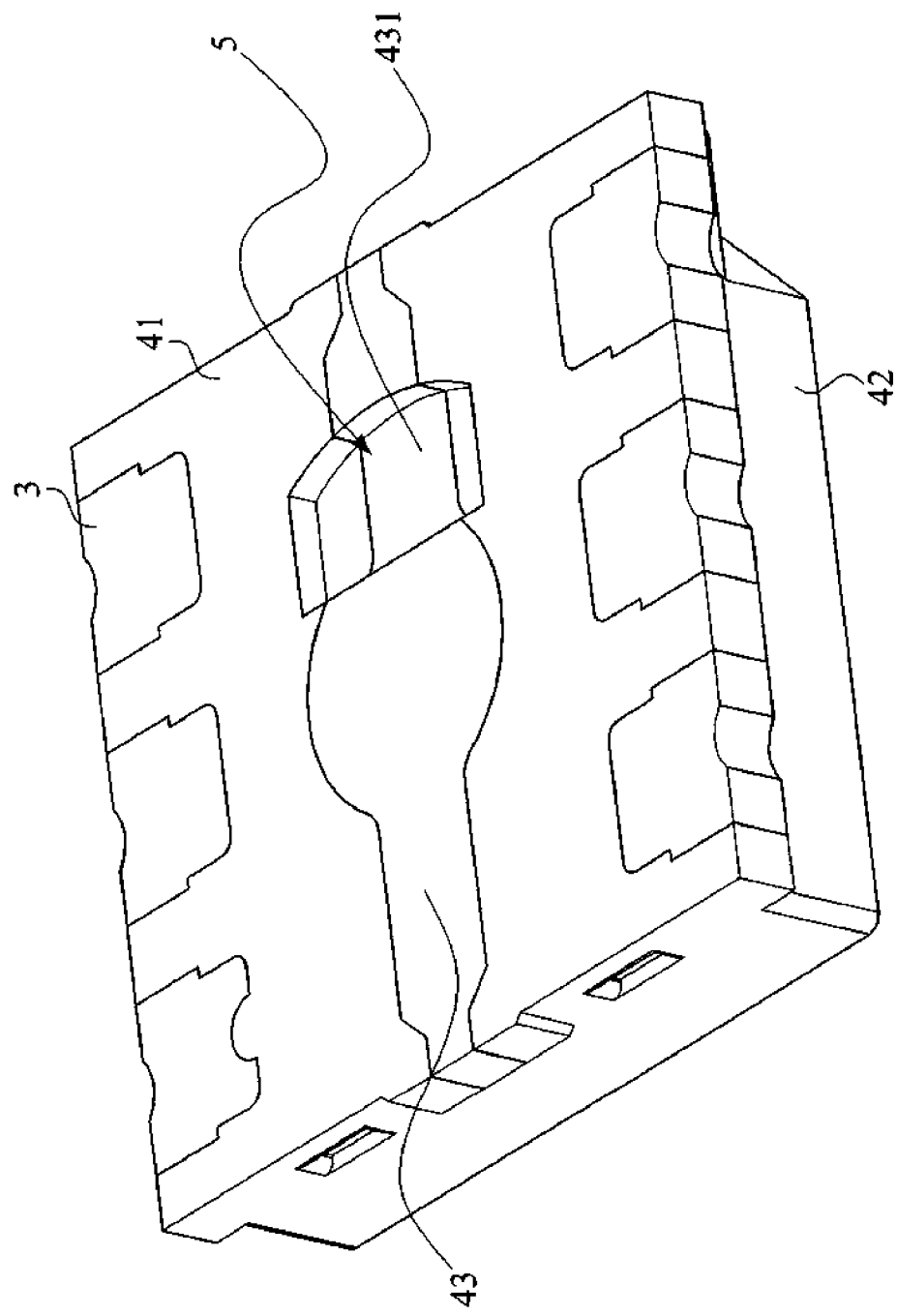
FIG. 6 is a perspective view of a second embodiment of the carrier structure in accordance with the present invention.

Referring now to FIG. 6, a perspective view (an upside down view by compared to FIG. 3) of a second embodiment of the carrier structure in accordance with the present invention is shown. The difference between this embodiment and the first embodiment shown from FIG. 3 through FIG. 5 is that in this second embodiment the accommodation room 5 for containing the electronic element 50 is formed at the lower portion of the insulation base 41 (i.e., the portion away from the reflection bowl structure 42) and is exposed to the bottom of the insulation base 41. Namely, in application of the second embodiment, the electronic element 50 in the accommodation room 5 is mounted under the heat-dissipating part 43, by compared to the above the heat-dissipating part 43 in the first embodiment.

Figure 7:
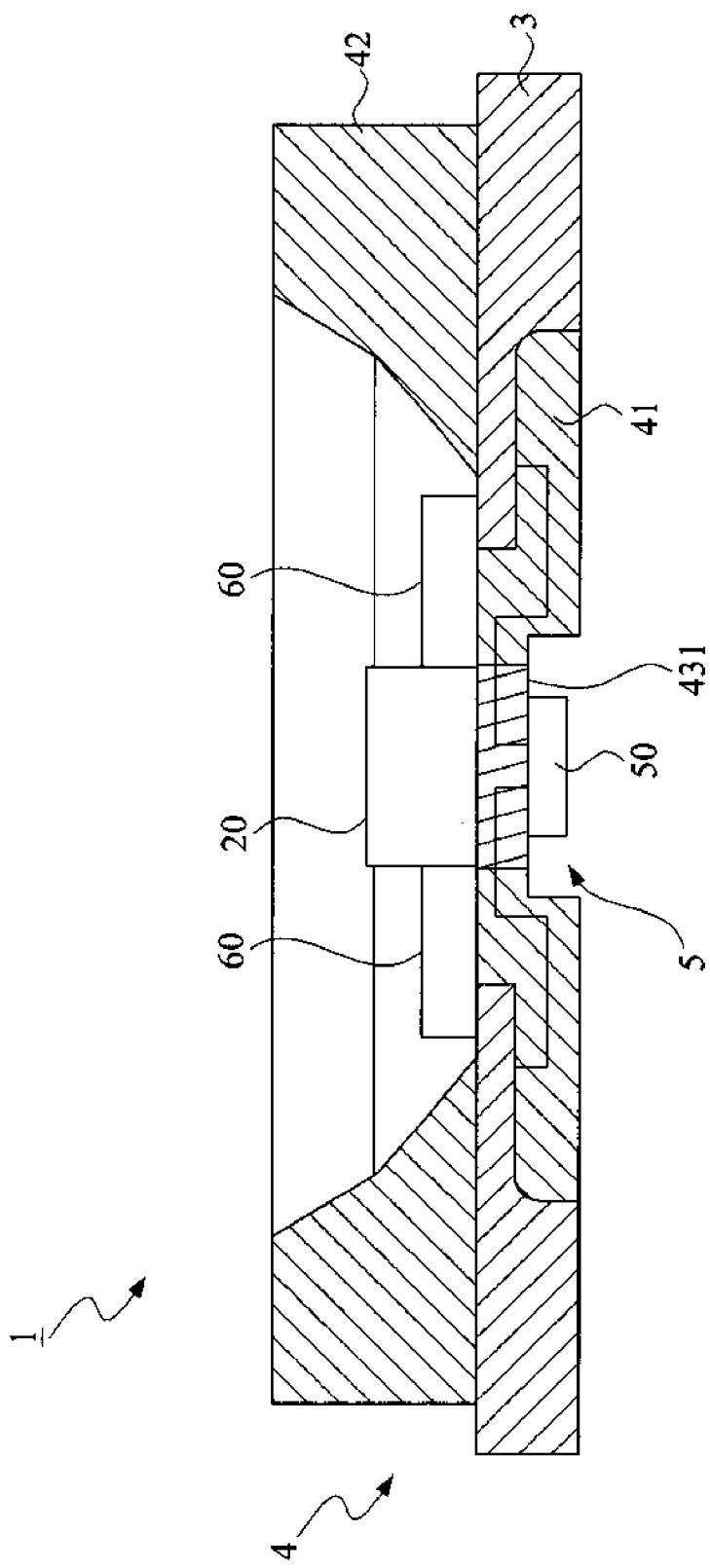
FIG. 7 is a cross-sectional view of FIG. 6.

Referring now to FIG. 7, a cross sectional view of FIG. 6, at an angle which is compared to the viewing angle of FIG. 5, is shown. As described above, the major difference between the first embodiment in FIG. 3 and the second embodiment in FIG. 6 is the location of the accommodation room 5 for nesting the electronic element 50. This major difference is clearly shown in FIG. 7. As shown, the accommodation room 5 of this second embodiment is located at the lower portion of the insulation base 41 and exposed to the atmosphere. With respect to the heat-dissipating part 43, the electronic element 50 is mounted under the bottom surface of the platform protrusion 431, such that the heat generated by the electronic element 50 can be dissipated through the heat-dissipating part 43.

In practice, the products shown in FIG. 5 and FIG. 7 can be further encapsulated as a unique device.

In the invention, by providing sufficient leads 3 and space in the reflection bowl structure, the carrier structure 1 can be used to mount a limited number of the LED chips 20 for accounting to different or various wavelength lights. For example in FIG. 5 or FIG. 7, three LED chips accounted for a red light LED, a blue light LED and a yellow light LED can be planted to the six leads 3 provided in the carrier structure 1.

Figure 1:
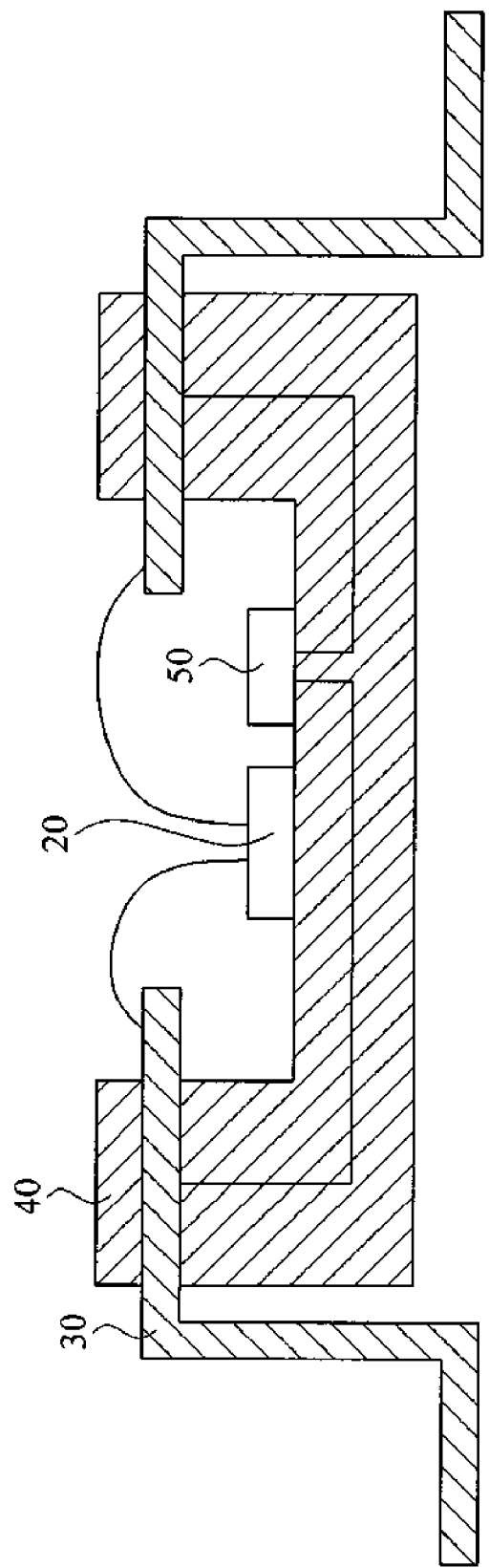
FIG. 1 is a schematic cross-sectional view of a typical LED packaging in the art.
Figure 2:
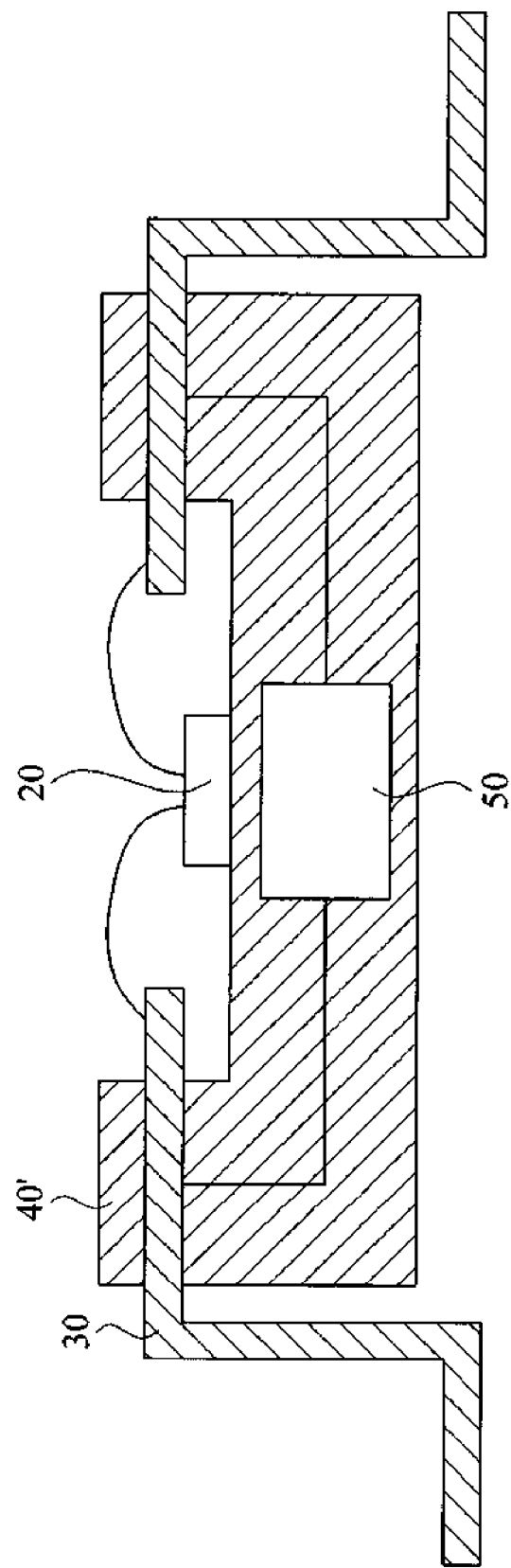
FIG. 2 is a schematic cross-sectional view of another LED packaging in the art.

By providing the accommodation room 5 for mounting the electronic element 50 separated from the space for mounting the LED chip 20 in accordance with the present invention, the aforesaid shuttering effect caused in between to the conventional structure as shown in FIG. 1 and FIG. 2 can be reduced to a minimum, without sacrificing the manufacturing cost and the yield.

While the present invention has been particularly shown and described with reference to a preferred embodiment, it will be understood by those skilled in the art that various changes in form and detail may be without departing from the spirit and scope of the present invention.

We claim:

1. A carrier structure for mounting at least an LED chip coupled in parallel with an electronic element, comprising:
    at least a lead connected electrically to the LED chip; and
    a base encaving the lead for housing the LED chip, the base having a shallow accommodation room recessed therein relative to the LED chip to mount the electronic element, and the electronic element being laterally offset from the LED chip;
    wherein said base further includes a heat-dissipating part and an insulation base, the heat-dissipating part encaved by the insulation base and sustaining thereabove said LED chip.

2. The carrier structure according to claim 1, wherein said electronic element is a drive chip.

3. The carrier structure according to claim 1, wherein said electronic element is a protection circuit.

4. The carrier structure according to claim 3, wherein said protection circuit has a cross voltage larger than another cross voltage of said LED chip.

5. The carrier structure according to claim 1, wherein said base further includes a reflection bowl structure for shielding said LED chip thereinside.

6. The carrier structure according to claim 5, wherein the carrier structure according to claim 1, wherein said accommodation room is located under said reflection bowl structure.

7. The carrier structure according to claim 1, wherein said accommodation room is located above said heat-dissipating part.

8. The carrier structure according to claim 1, wherein said accommodation room is located under said heat-dissipating part opposing to said LED chip.

9. The carrier structure according to claim 1, wherein said lead has an end thereof exposed out of said base.

10. The carrier structure according to claim 1, wherein said LED chip is wired to said lead.

11. The carrier structure according to claim 1, wherein said at least a lead includes six leads for connecting electrically to three LED chips housed by said base.

12. The carrier structure according to claim 11, wherein said three LED chips are accounted to different wavelength lights.

* * * * *